United States Patent
Kent et al.

(10) Patent No.: US 11,906,578 B2
(45) Date of Patent: Feb. 20, 2024

(54) SYSTEM AND METHOD FOR RAPID INSPECTION OF PRINTED CIRCUIT BOARD USING MULTIPLE MODALITIES

(71) Applicant: Battelle Memorial Institute, Columbus, OH (US)

(72) Inventors: Thomas F. Kent, Columbus, OH (US); Jeremiah P. Schley, Columbus, OH (US); Anthony F. George, Columbus, OH (US); Richard J. Higgins, Lewis Center, OH (US); Katie T. Liszewski, Powell, OH (US); David Maung, Columbus, OH (US)

(73) Assignee: BATTELLE MEMORIAL INSTITUTE, Columbus, OH (US)

( * ) Notice: Subject to any disclaimer, the term of this patent is extended or adjusted under 35 U.S.C. 154(b) by 827 days.

(21) Appl. No.: 17/022,834

(22) Filed: Sep. 16, 2020

(65) Prior Publication Data

US 2021/0082101 A1   Mar. 18, 2021

Related U.S. Application Data

(60) Provisional application No. 62/901,442, filed on Sep. 17, 2019.

(51) Int. Cl.
*G01R 31/309* (2006.01)
*G01N 21/956* (2006.01)
(Continued)

(52) U.S. Cl.
CPC ......... *G01R 31/309* (2013.01); *G01N 21/956* (2013.01); *G05B 19/4099* (2013.01);
(Continued)

(58) Field of Classification Search
CPC .............. G01R 31/309; G01R 31/2656; G01N 21/956; G01N 2021/95638;
(Continued)

(56) References Cited

U.S. PATENT DOCUMENTS

| | | | |
|---|---|---|---|
| 10,215,695 B1* | 2/2019 | Farooq | G01N 21/8806 |
| 2004/0004482 A1 | 1/2004 | Bouabdo et al. | |
| 2011/0002528 A1* | 1/2011 | Bajura | G06T 7/001 382/145 |

FOREIGN PATENT DOCUMENTS

| | | | | |
|---|---|---|---|---|
| CN | 110070536 A | * | 7/2019 | ........... G06K 9/2054 |
| KR | 2010 0121560 A | | 11/2010 | |
| WO | WO 2016/099636 A1 | | 6/2016 | |

OTHER PUBLICATIONS

Soden et al. "IC Failure Analysis: Techniques and Tools for Quality and Reliability Improvement." Proceedings of the IEEE, vol. 81, issue 5, May 1993, pp. 703-715 (Year: 1993).*

(Continued)

*Primary Examiner* — Jon Chang
(74) *Attorney, Agent, or Firm* — Lippes Mathias LLP

(57) ABSTRACT

A multispectral inspection (MSI) device for analyzing an electronic item having a printed circuit board (PCB). An electronic power supply powers the electronic item in accordance with one or more test vectors. An optical imaging scanner, terahertz (THz) imaging scanner, and a functional imaging scanner are each operative to scan the electronic item. An electronic processor is programmed to scan the various scanners and control the power supply to acquire optical, THz, and functional images of the electronic item. The images are combined to form a standard three-dimensional (3D) signature and artificial intelligence (AI) classifiers are applied to the 3D signature to perform non-destructive analyses of the electronic item.

24 Claims, 6 Drawing Sheets

(51) Int. Cl.

| | |
|---|---|
| *G06T 7/00* | (2017.01) |
| *G06V 20/62* | (2022.01) |
| *G06V 30/19* | (2022.01) |
| *G06N 20/00* | (2019.01) |
| *G05B 19/4099* | (2006.01) |
| *G06Q 10/0639* | (2023.01) |
| *G06Q 10/0875* | (2023.01) |
| *G06Q 10/10* | (2023.01) |
| *G06Q 30/018* | (2023.01) |
| *G06F 18/24* | (2023.01) |
| *H04N 23/951* | (2023.01) |
| *G01S 13/89* | (2006.01) |

(52) U.S. Cl.
CPC ............ *G06F 18/24* (2023.01); *G06N 20/00* (2019.01); *G06Q 10/06395* (2013.01); *G06Q 10/0875* (2013.01); *G06Q 10/10* (2013.01); *G06Q 30/0185* (2013.01); *G06T 7/001* (2013.01); *G06V 20/62* (2022.01); *H04N 23/951* (2023.01); *G01N 2021/95638* (2013.01); *G01S 13/89* (2013.01); *G05B 2219/49023* (2013.01); *G06T 2207/10048* (2013.01); *G06T 2207/20081* (2013.01); *G06T 2207/30141* (2013.01); *G06V 30/19173* (2022.01)

(58) Field of Classification Search
CPC ........... G01N 21/3586; G01N 21/3581; G06N 20/00; G05B 19/4099; G05B 2219/49023; G06F 18/24; G06Q 10/06395; G06Q 10/0875; G06Q 10/10; G06Q 30/0185; G06T 7/001; G06T 2207/10048; G06T 2207/20081; G06T 2207/30141; G06V 20/62; G06V 30/19173; H04N 23/951; G01S 13/89
See application file for complete search history.

(56) References Cited

OTHER PUBLICATIONS

De Oliveira et al. "Detecting Modifications in Printed Circuit Boards from Fuel Pump Controllers." 30th SIBGRAPI Conference on Graphics, Patterns and Images, Oct. 17, 2017, pp. 87-94 (Year: 2017).*

English translation of CN110070536A (Year: 2019).*

P I Nicholson et al: "Development of a Comprehensive In-Line Quality Control System for Printed Circuit Board Assemblies", Circuit World, Issue 4, vol. 33, 2007, Jan. 31, 2007 (Jan. 31, 2007), pp. 1-26, XP055759355, Retrieved from the Internet: URL:https://www.twi-global.com/technical-knowledge/published-papers/development-of-a-comprehensive-in-line-quality-control-system-for-printed-circuit-board-assemblies-october-2007 [retrieved on Dec. 11, 2020].

Richter Johannes et al: "Deep Learning Based Fault Correction in 3D Measurements of Printed Circuit Boards", 2018 IEEE 9th Annual Information Technology, Electronics and Mobile Communication Conference (IEMCON), IEEE, Nov. 30, 2018 (Nov. 30, 2018), pp. 227-232, XP033498985, DOI: 10.1109/IEMCON.2018.8614932 [retrieved on Jan. 16, 2019].

Richter Johannes et al: "On the development of intelligent optical inspections", 2017 IEEE 7th Annual Computing and Communication Workshop and Conference (CCWC), IEEE, Jan. 9, 2017 (Jan. 9, 2017), pp. 1-6, XP033072485, DOI: 10.1109/CCWC.2017.7868455 [retrieved on Mar. 1, 2017].

Rayko Ivanov Stantchev et al: "Noninvasive, near-field terahertz imaging of hidden objects using a single-pixel detector", Science Advances, vol. 2, No. 6, Jun. 1, 2016 (Jun. 1, 2016), p. e1600190, XP055759810, DOI: 10.1126/sciadv.1600190.

Tak Ming Wong et al: "Computational Image Enhancement for Frequency Modulated Continuous Wave (FMCW) THz Image", arxiv.org, Cornell University Library, 201 Olin Library Cornell University Ithaca, NY 14853, Feb. 15, 2018 (Feb. 15, 2018), XP081387050, DOI: 10.1007/S10762-019-00609-W.

Wright R G et al: "Circuit board testing through multi-spectral signal analysis", Autotestcon, 2005. IEEE Sep. 26, 2005, Piscataway, NJ, USA, IEEE, Sep. 26, 2005 (Sep. 26, 2005), pp. 751-757, XP010910970, DOI: 10.1109/AUTEST.2005.1609231 ISBN: 978-0-7803-9101-7.

Glenn Wright R: "Multiresolution sensor fusion approach to PCB fault detection and isolation", Autotestcon, 2008 IEEE, IEEE, Piscataway, NJ, USA, Sep. 26, 2005 (Sep. 26, 2005), pp. 41-46, XP031354999, ISBN: 978-1-4244-2225-8.

International Search Report dated Jan. 11, 2021 from PCT/US2020/053032.

* cited by examiner

SYSTEM AND METHOD FOR RAPID INSPECTION OF PRINTED CIRCUIT BOARD USING MULTIPLE MODALITIES

This application claims the benefit of U.S. Provisional Application No. 62/901,442 filed Sep. 17, 2019 and titled "SYSTEM AND METHOD FOR RAPID INSPECTION OF PRINTED CIRCUIT BOARD USING MULTIPLE MODALITIES". U.S. Provisional Application No. 62/901,442 filed Sep. 17, 2019 and titled "SYSTEM AND METHOD FOR RAPID INSPECTION OF PRINTED CIRCUIT BOARD USING MULTIPLE MODALITIES" is incorporated herein by reference in its entirety.

BACKGROUND

The following relates to the electronic device non-destructive analysis (NDA) arts, electronic device quality assurance arts, electronic device counterfeiting detection arts, and the like.

Electronic Commercial Off-The-Shelf (COTS) items are packaged electronic components that are used in custom systems. Usually, an electronic COTS item comprises a printed circuit board (PCB) with various integrated circuits (ICs) and discrete components mounted on the PCB and electrically interconnected by printed circuitry of the PCB. For example, a military air force or civilian airline may use a COTS item as an aircraft component. In many cases, the customer (e.g. air force or airline) will qualify a COTS item for use in a particular system (such as a particular model/make aircraft) based on component specifications and/or extensive testing to ensure the COTS item meets stringent performance and reliability criteria. For example, an air force may require all ICs in a COTS item to be "military grade", for example having an operational temperature range meeting some required standard.

Unfortunately, the outsourcing implicit in using a COTS item means that the customer does not control the manufacturing/supply chain producing the COTS item. For example, the manufacturer may make an undocumented revision to the COTS item that may potentially affect the customer. Another concern with employing COTS items in a system is that there is the potential to receive a counterfeit COTS item, which may have substitute (possibly lower quality) parts, or may introduce privacy-compromising capabilities or other issues. Another concern with employing COTS items is that the COTS item may not meet performance specifications provided by the supplier. This can occur due to use of lower performing counterfeit parts, use of manufacturing parameters that do not meet performance specifications, or so forth. For example, the peak operating temperature of a microprocessor depends upon many factors, such as the adequacy of its heat sinking, details of ancillary component (e.g. resistors) electrically connected with the microprocessor, and the particular firmware or software that the microprocessor executes. Some of these factors can be dependent upon manufacturing process particularities. For example, if heat sinking is provided in part by a metal layer disposed underneath the microprocessor and deposited on the PCB by a vacuum evaporation process, then errors in execution of the vacuum evaporation process can lead to inadequate heat sinking and hence to the COTS item failing to meet the microprocessor peak temperature specification. These types of performance deficiencies can result from inadvertent supplier errors, or can result from less innocent cost cutting measures taken by the supplier.

These types of concerns can be alleviated by testing of COTS items. In destructive analysis approaches, the COTS item is disassembled or otherwise destructively analyzed to assure it meets the requisite specifications. Naturally, destructive analysis can only be performed on "extra" COTS items delivered to the customer, which increases cost at the customer end. Furthermore, destructive analysis cannot provide assurance that the particular COTS item that is actually installed in a customer system meets specifications. Non-destructive analysis (NDA) overcomes these deficiencies. However, some manufacturing processes include minimal NDA, and existing NDA techniques can have disadvantages such as long test times and inability to detect certain types of flaws.

Certain improvements are disclosed herein.

BRIEF SUMMARY

In accordance with some illustrative embodiments disclosed herein, a multispectral inspection (MSI) device for inspecting an associated electronic item including a printed circuit board (PCB) comprises: an electronic power supply configured to electrically power the associated electronic item in accordance with one or more test vectors; an optical imaging scanner configured to scan the associated electronic item; a functional imaging scanner configured to scan the associated electronic item; and an electronic processor. The optical imaging scanner preferably has a lateral spatial image resolution of 100 micron or finer. The functional imaging scanner preferably has a lateral spatial image resolution of 100 micron or finer. The electronic processor is programmed to: control the optical imaging scanner to acquire an optical image of the associated electronic item; and control the functional imaging scanner and the electronic power supply to acquire one or more functional images of the associated electronic item powered in accord with respective one or more test vectors using the electronic power supply.

In accordance with some illustrative embodiments disclosed herein, an MSI method is on an associated electronic item having a PCB. The MSI method comprises: controlling an optical imaging scanner to acquire an optical image of the associated electronic item; analyzing the optical image to identify areas of significance of the associated electronic item; controlling a functional imaging scanner and an electronic power supply to acquire functional area images of the areas of significance with the associated electronic item powered in accord with one or more test vectors using the electronic power supply; generating a functional image for each test vector by combining the functional images acquired with the associated electronic item powered in accord with that test vector; generating a three-dimensional (3D) signature for the associated electronic item comprising a stack of the optical image and the functional images at the one or more test vectors; and performing at least one MSI analysis by processing the 3D signature using one or more artificial intelligence (AI) classifiers.

In accordance with some illustrative embodiments disclosed herein, a non-transitory storage medium stores instructions readable and executable by an electronic processor to perform an MSI method on an associated electronic item. The MSI method comprises: controlling an optical imaging scanner to acquire an optical image of the associated electronic item; analyzing the optical image to identify electronic components mounted on the PCB, locations of the electronic components on the PCB, and structural metrics of the electronic components; performing optical character recognition (OCR) on the optical image to identify textual content with associated locations on the PCB; and labeling the identified electronic components with part identifiers based at least on the structural metrics of the electronic components and the textual content with associated locations on the PCB.

BRIEF DESCRIPTION OF THE DRAWINGS

Any quantitative dimensions shown in the drawing are to be understood as non-limiting illustrative examples. Unless otherwise indicated, the drawings are not to scale; if any aspect of the drawings is indicated as being to scale, the illustrated scale is to be understood as non-limiting illustrative example.

In FIG. 1, the electronic item under test and the translation table are shown rotated at 90° into a plan view.

DETAILED DESCRIPTION

In embodiments disclosed herein, a multispectral inspection (MSI) system comprises a spatially correlated, multi-modal imaging platform of passive and active sensing modalities, for non-destructively characterizing a printed circuit board (PCB) using a multi-spectral approach: visible spectrum to capture surface features, terahertz (THz) spectroscopy to capture sub-surface features, and a functional imaging modality such as infrared (IR) and/or electromagnetic interference imaging (EMI) to capture device functionality during operation. All data is spatially correlated to build a verifiable multispectral signature which is unique to each electronic item.

Figure 1:
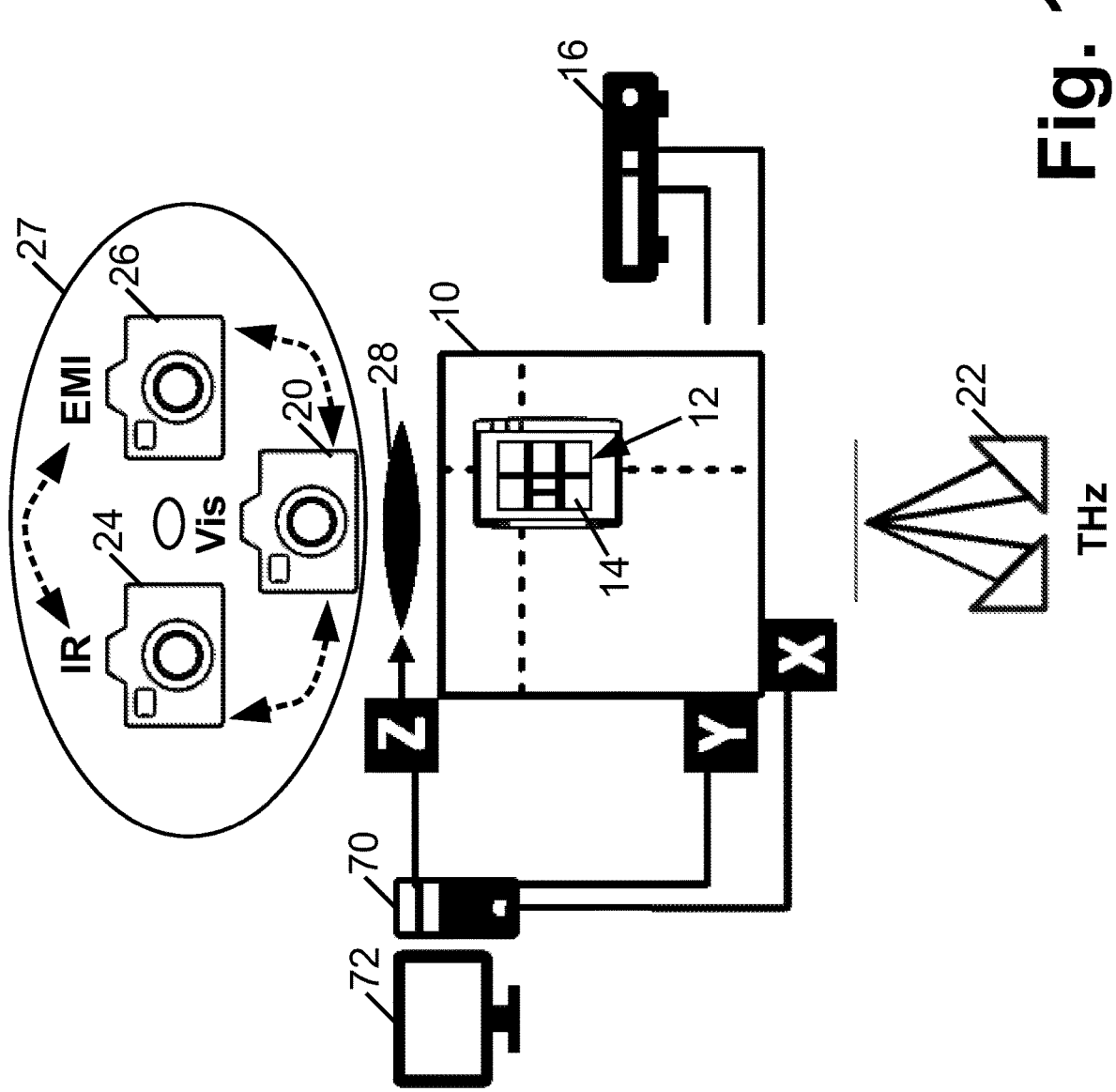
FIG. 1 diagrammatically shows a multispectral inspection (MSI) system as disclosed herein.
Figure 2:
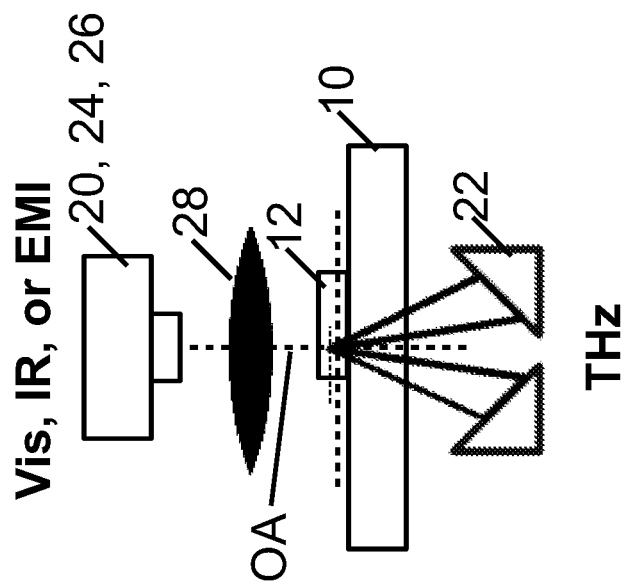
FIG. 2 diagrammatically shows a side-sectional view of a simplified representation of the MSI system of FIG. 1 showing only two imaging modalities and the translation table and electronic item under test, with the electronic item under test and the translation table not rotated into plan view as was done in FIG. 1.

FIGS. 1 and 2 diagrammatically show an illustrative MSI system. A translation table 10 is configured to laterally translate an electronic item under test 12 in a plane of a printed circuit board (PCB) 14 of the electronic item 12. The electronic item 12 typically comprises the PCB 14 (or, in some cases, two or more PCBs 14 mounted in parallel to provide more space for circuitry) and electronic components mounted on the PCB 14. The electronic components may, for example, include integrated circuits (ICs) such as microprocessors, memory chips, field programmable gate arrays (FPGAs), or so forth. The electronic components typically also include lumped elements such as resistors, capacitors, inductors, or so forth. It is contemplated for the electronic components to include optoelectronic components such as semiconductor lasers or light emitting diodes (LEDs), and may further have mounted on the PCB 14 optical components such as lenses or mirrors.

A power supply 16 is provided to electrically power the electronic item 12 in accord with one or more test vectors. Each test vector is an operational state of the electronic item 12. For example, one test vector may be the device powered at a specified power level; another test vector may additionally include applying specified voltage to one or more static and/or dynamically varying analog and/or digital inputs of the electronic item 12. The test vector(s) will typically be designed by engineers based on a priori knowledge of the physical layout of the circuitry, expected (e.g. design basis) functional characteristics, and so forth, in order to test specific features of the electronic item 12, such as causing a microprocessor to operate at high speed so as to test its maximum operating temperature, causing various components to intercommunicate in order to verify connections between the components, and/or so forth.

The illustrative MSI device includes only one translation table 10 which is used to implement lateral scanning of the electronic item 12 for all imaging modalities, which in the illustrative example include a visible imaging scanner 20, a terahertz (THz) imaging scanner 22, and a functional imaging scanner (specifically two functional imaging scanners in the illustrative example), namely an infrared imaging scanner 24 and an electromagnetic interference imaging (EMI) scanner 26. FIG. 1 shows the electronic item 12 under test and the translation table 10 rotated at 90° into a plan view; while, FIG. 2 shows a simplified view including only two imaging modalities (and the translation table and electronic item under test, with the electronic item under test and the translation table not rotated into plan view as was done in FIG. 1. As diagrammatically shown in FIG. 1, the lateral scanning is in orthogonal directions conventionally designated as orthogonal X- and Y-directions. The X- and Y-directions are in the plane of the PCB 14 of the electronic item under test 12, so that the lateral scanning scans across the PCB 14. This is merely an illustrative embodiment, and other arrangements for supporting the PCB 14 and for implementing the optical, THz, and functional imaging scanning are contemplated. For example, in another embodiment the translation table 10 is replaced by a stationary table, and the visible imaging scanner, the optional THz scanner, and the functional imaging scanner are each configured to move respective to the stationary table to scan the associated electronic item. Additionally or alternatively, the table could be replaced by another type of support. For example, the table could be replaced by a frame that holds the PCB 14 by its peripheral edges. This approach advantageously can allow for unobstructed view of both sides of the PCB 14.

In the illustrative embodiment, the visible imaging scanner 20, the IR imaging scanner 24, and the EMI scanner 26 are arranged on one side of the translation table 10 (designated a "top" side) on which the electronic item 12 is also disposed. The three top-side scanners 20, 24, 26 are mounted on a linear conveyor belt or (diagrammatically illustrated) revolving conveyor 27 allowing for any one of the three top-side scanners 20, 24, 26 to be placed into an operational position along the optical axis OA (indicated in FIG. 2) of a telecentric lens 28. Hence, in the illustrative example only one of the three top-side scanners 20, 24, 26 can be in use at any given time. This top-side arrangement provides these scanners 20, 24, 26 with a direct view of the electronic item 12 that is not occluded by the translation table 10. The telecentric lens 28 provides an orthographic projection so that the magnification of the lens-to-object distance. The telecentric lens 28 has a large depth of focus, e.g. at least 25 mm depth of focus in some embodiments. The illustrative THz imaging scanner 22 is arranged on the opposite side (designated as a "bottom" side) of the translation table 10, also aligned with the optical axis OA of the telecentric lens 28 (although the THz imaging scanner 22 does not use the telecentric lens 28). This allows the THz imaging scanner 22 and whichever imaging scanner 20, 24, 26 is translated or rotated into alignment with the optical axis OA to simultaneously scan the same lateral area of the PCB 14. Advantageously, the THz probe waves employed by the THz imaging scanner 22 pass unimpeded through the translation table 10. The translation table 10 also optionally provides Z-directional adjustment, and/or a telecentric lens 28 may be movable in the Z-direction (that is, orthogonal to both lateral X- and Y-directions) to provide focusing for the imaging modalities 20, 24, 26. It is to be appreciated that the illustrative four imaging or scanning modalities (visible, IR, EMI, and THz) are merely examples, and it is contemplated for the multispectral inspection (MSI) system to employ additional and/or other imaging or scanning modalities, such as millimeter imaging, sub-millimeter imaging, and/or so forth.

The visible imaging scanner 20 is operative in conjunction with lateral translation of the electronic item 12 respective to the visible imaging scanner 20 using the translation table 10. The visible imaging scanner 20 is shown diagrammatically in FIGS. 1 and 2. In a typical implementation, the visible imaging scanner 20 includes a suitable imaging sensor chip (e.g., a CMOS or CCD array). The visible imaging scanner 20 may employ a color sensor chip or a monochrome sensor chip (where the monochrome imaging wavelength or band is in the visible range of 400-700 nm). Typically, a monochrome sensor chip provides higher spatial resolution. The visible imaging scanner 20 preferably has a lateral spatial image resolution of 100 micron or finer. The visible imaging scanner 20 can operate using the ambient (e.g. room) light, or may include a dedicated light source such as a ring light to provide uniform illumination.

The THz imaging scanner 22 is operative in conjunction with lateral translation of the electronic item 12 respective to the THz imaging scanner 22 using the translation table. A non-limiting illustrative embodiment of the THz imaging scanner 22 may employ a femtosecond (fs) laser (e.g., a Femtolite F-100 femtosecond laser available from IMRA America, Inc.) to generate pump pulses. A beam splitter reflects one portion of the pump pulse to a THz emitter (photoconductive antenna) to generate a THz wave (typically in a frequency range of 0.1-10 THz) directed to the electronic item 12. A THz wave reflected by the electronic item 12 is directed to a THz detector (also a photoconductive antenna). The portion of the pump pulse that is not reflected by the beam splitter passes through an adjustable delay system and the delayed pump pulse forms a gating pulse that is input to the THz detector. A lock-in amplifier measures the electrical signal generated by the THz detector. This signal is strongest for the THz reflection depth in the electronic item 12 whose phase matches the phase of the delayed gating pulse. Hence, the delay imposed on the gating pulse determines the imaging depth of the THz imaging scanner. This is merely a non-limiting illustrative example, and other THz imaging designs are also contemplated. The THz imaging scanner 22 preferably has a lateral spatial image resolution of 500 micron or finer and a depth resolution of 100 microns or less.

The functional imaging scanner (e.g., the IR imaging scanner 24 and/or the EMI scanner 26) is operative in conjunction with lateral translation of the electronic item 12 respective to the functional imaging scanner 24, 26 using the translation table 10. The functional imaging scanner 24, 26 preferably has a lateral spatial image resolution of 100 micron or finer.

Figure 3:
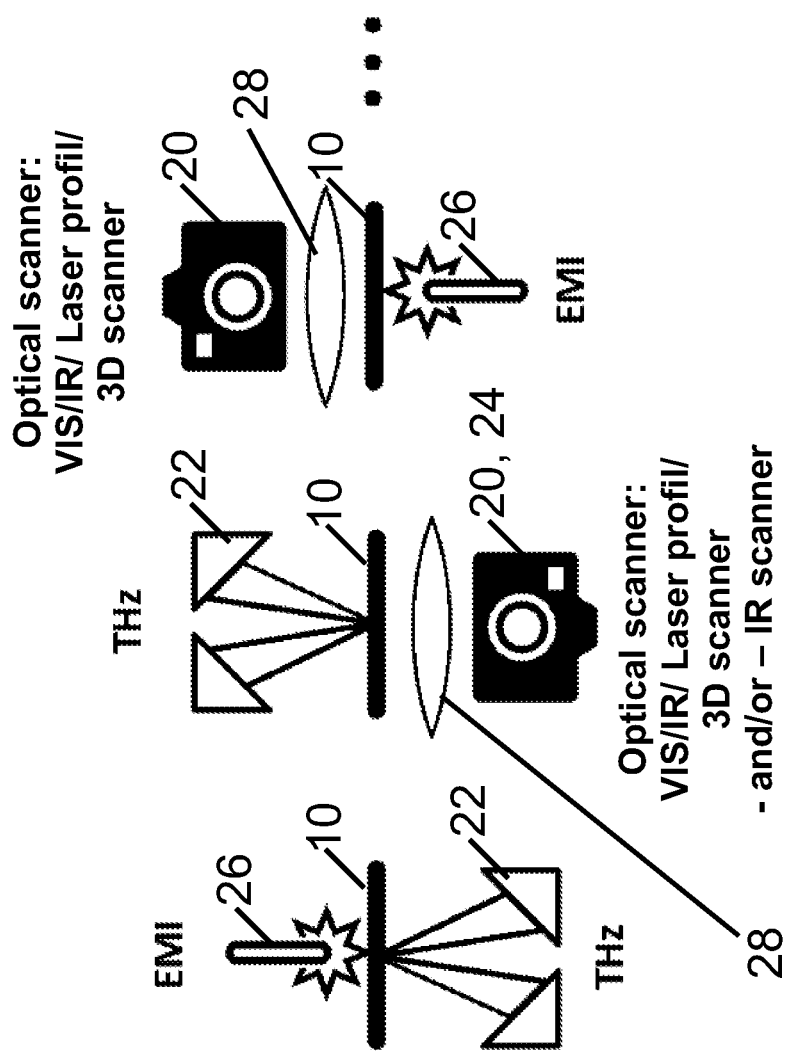
FIG. 3 diagrammatically shows other possible configurations of imaging modalities in the MSI system.

With reference to FIG. 3, some other possible configurations of imaging modalities in the MSI system are diagrammatically shown. In the lefthand example, the imager includes the EMI imager 26 located topside of the support 10 and the THz imager 22 located bottomside of the support 10. The middle example shows the THz imager 22 located topside of the support 10 and the visible and/or IR imager(s) 20, 24 and telecentric lens 28 located bottomside of the support 10. The righthand example shows the visible imager 20 and telecentric lens 28 located topside of the support 10 and the EMI imager 26 located bottomside of the support 10. These are merely further examples. More generally, simultaneous measurements using two modalities can be realized by fixing any of the two imaging modalities coaxially on either side of the COTS device and expect no interference. In some such arrangements, access to the PCB 14 on both sides is enabled by fixing the PCB 14 using a mechanical support frame including clips, temporary adhesive, or so forth that engages only the edges (or otherwise insignificant portions) of the PCB 14. Moreover, it is to be understood that the MSI system may include only a subset of the illustrative visible, IR, EMI, and THz imaging modalities, and/or may include additional imaging modalities beyond the illustrative visible, IR, EMI, and THz imaging modalities. For example, the MSI system may include an optical profilometer as a further (or substitute) imaging modality. Optical profilometry scans a laser beam or other light beam over the surface of the electronic item 12 and determining the surface profile from the reflected beam based on time-of-flight measurements, an optical interference pattern, analysis of a projected pattern, or so forth. Another contemplated imaging modality is a three-dimensional (3D) scanner employing two or more cameras to provide a stereographic view. In general, it is useful to have at least one optical imaging scanner that provides information about the physical layout and/or topology of the PCB and its components, and at least one functional imaging scanner that provides functional imaging that is in general dependent upon the applied test vector. The optical scanner(s) is generally considered to provide images that are independent of any applied test vector, although some response to a test vector is possible. (For example, an optical imaging scanner may in some instances detect a small thermal expansion of a component due to heating during application of a test vector; or an optical scanner may detect emission of a laser diode component mounted on the PCB). Typically (although not necessarily), the optical scanner will be used without an applied test vector. The at least one optical imaging scanner can include one or more of, for example, the illustrative visible imaging scanner 20 (which may optionally encompass less than the entire visible spectral range, and/or may encompass a spectral range extending beyond the visible spectrum into the near infrared spectral range and/or into the near ultraviolet spectral range), a laser profilometer, a 3D scanner, and/or so forth. The at least one functional imaging scanner can include one or more of, for example, the IR scanner 24, the EMI scanner 26, and/or so forth, which detects infrared and/or other electromagnetic emissions from the PCB and/or its components in response to an applied test vector. The THz imager 22, if included, provides additional information in the form of depth profiling. Additional and/or other imaging or scanning modalities may be provided to provide depth profiling, i.e. sub-surface imaging information. For example, millimeter imaging (e.g., in the 60-100 GHz range) can be employed. A millimeter imager may suitably employ a multiple-input multiple-output (MIMO) phased array radar to provide FMCW (frequency modulated continuous wavelength) millimeter imaging with a spatial resolution of typically on the order of 1 mm. In initial tests, it was found that millimeter imaging is capable of distinguishing between nominally identical epoxy supplied by different vendors. Hence, millimeter imaging is expected to be useful for detecting material substitutions in an electronic item. Another contemplated imaging or scanning modality is sub-millimeter imaging, for example employing a $K_a$ band source, which is also expected to provide depth profiling, i.e. sub-surface imaging information.

To provide an integrated MSI system, an electronic processor 70, such as an illustrative computer, is programmed to: control the visible imaging scanner 20 and the translation table 10 to acquire a visible image of the electronic item 12; control the THz imaging scanner 22 and the translation table 10 to acquire one or more THz images of the electronic item 12 at respective one or more depths (controlled by the adjustable delay reflector system 54); and control the functional imaging scanner 24, 26 and the translation table 10 and the electronic power supply 16 to acquire one or more functional images of the electronic item 12 powered in accord with respective one or more test vectors using the electronic power supply 16. The electronic processor 70 is further programmed to perform various data processing on these images as disclosed here. Typically, a display 72 is integrated with or operatively connected with the electronic processor 70 to display the images and/or reports on the electronic item 12 generated by the MSI system.

The visible imaging scanner 20, the THz imaging scanner 22, and the functional imaging scanner 24, 26 provide complementary information for characterizing the electronic item 12 under test. The visible imaging scanner 20 provides information about surface level features such as outlines of electronic components, PCB traces, and so forth. The visible imaging scanner 20 also images surface lettering, such as textual part identifiers printed on ICs. The THz imaging scanner 22 provides non-destructive volumetric information on material composition. The functional imaging scanner 24, 26 operates with the electronic item 12 operating in accord with a test vector, and provides functional information such as electric current flow and/or operating temperatures of components. The use of two functional imaging modalities in the illustrative example (namely the IR imaging scanner 24 and the EMI scanner 26) provides benefits as discussed herein. However, it is contemplated to employ only a single functional modality, e.g. only IR or only EMI.

Although there are potential synergistic benefits of the multiple modalities as just described, there are also substantial difficulties in combining data from the different modalities. The images employ different informational units, e.g. visible light intensity, infrared intensity and/or electromagnetic interference as a function of test vector, THz reflectivity as a function of depth. The images also have different spatial resolutions, and it is challenging to spatially register the different imaging modalities with sub-millimeter accuracy. A further problem is that image scanning using these modalities at sub-millimeter lateral spatial image resolution is time consuming. For example, scanning one side of a 14"×14" PCB in the visible spectrum can take around 30 minutes; IR imaging times are similar, and even longer scan times are required for THz imaging.

In approaches disclosed herein, these difficulties are addressed. The use of the single translation table 10 with all imaging modalities aligned to a single static optical axis OA automatically provides spatial registration of the images of the different modalities to within lateral tolerances of the linear conveyor belt or a revolving conveyor 27 and the accuracy with which the THz imaging scanner 22 is aligned with the optical axis OA. If this intrinsic spatial registration is insufficient, then an optional further spatial image registration may be performed by the electronic processor 70—such an image registration can be done rapidly and accurately since the images are already close to the final registration alignment. Lengthy scan times are addressed by using the visible imaging modality 20 to acquire a visible image of the electronic item 12, analyzing the visible image to identify areas of significance of the electronic item 12 (for example, electronic components, or further limited to electronic components that are suspicious based on content of the visible image), and performing the THz imaging and functional imaging of only those areas of significance. The differences in spatial resolution of the different-modality images is accounted for by resampling the images to a single lateral resolution. To avoid losing any information in the resampling, in some embodiments the single lateral resolution chosen for the resampling is the highest resolution of any portion of the visible image, the one or more THz images, and the one or more functional images, and the resampling entails upsampling any portion of any image with coarser resolution (than this highest resolution) to the highest resolution. The differences in informational units is handled by combining the visible image, the one or more THz images, and the one or more functional images to generate a three-dimensional (3D) signature for the electronic item 12 comprising a stack of the images (for example, suitably represented by a three-dimensional array data structure or an equivalent data structure) and then processing the 3D signature using artificial intelligence (AI) classifiers trained on labeled 3D signatures of training electronic items.

In the following MSI method examples, the electronic item 12 is sometimes referred to as a Commercial Off-The-Shelf (COTS) item. This reflects a typical MSI task suitably performed by the MSI system of FIGS. 1-3, namely assessment of a COTS item to verify that it conforms with the specifications set for the COTS product of which the COTS item is (purportedly) an instance. However, it will be appreciated that the MSI systems and methods described herein are readily applied to other situations, such as performing MSI on an unknown electronic item, verifying a prototype (e.g. custom-built, possible one-of-a-kind) electronic item meets expected structural, thermal, and functional goals, and/or so forth.

Figure 4:
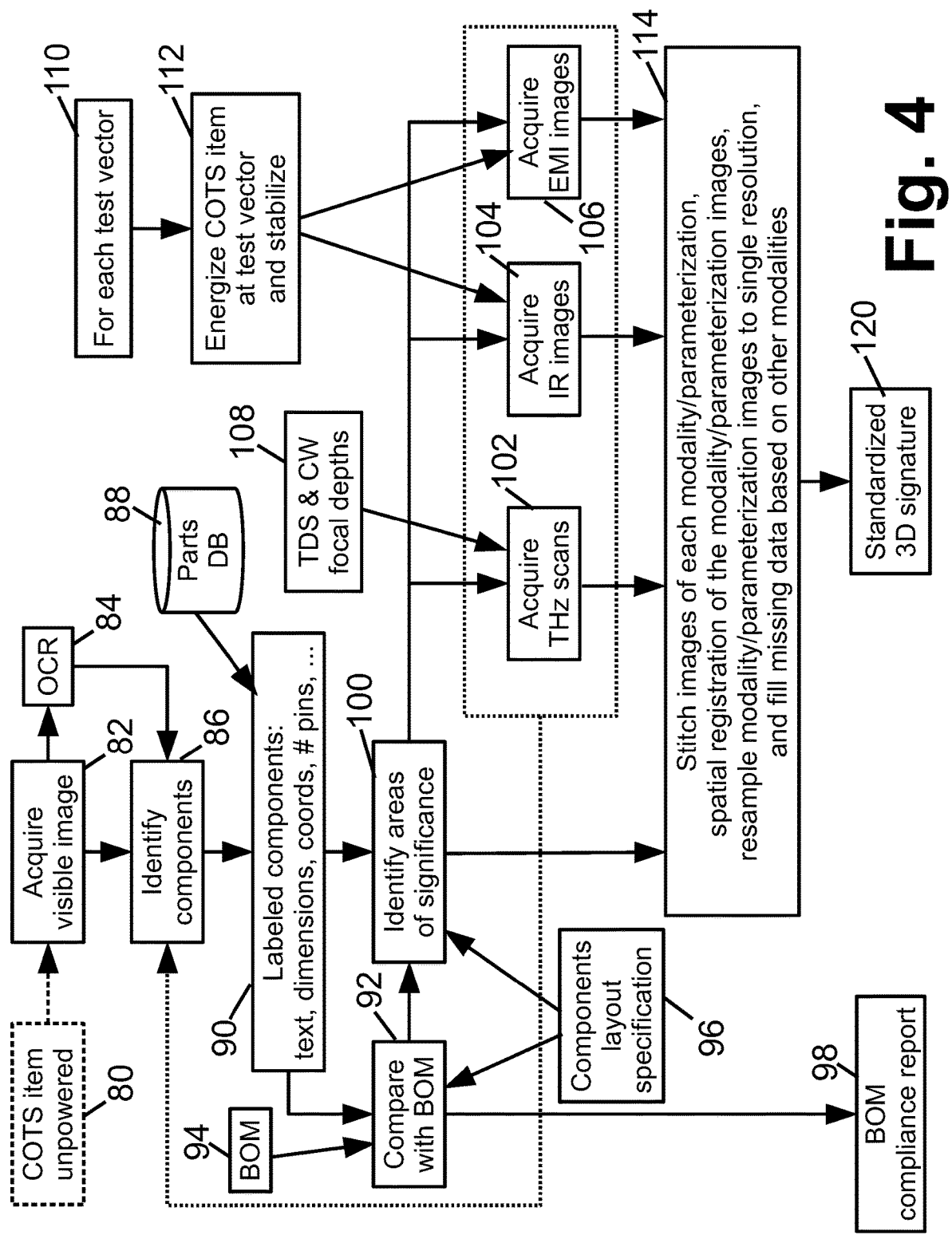
FIG. 4 diagrammatically shows a suitable process performed by the multi-modal MSI system of FIGS. 1 and 2 for generating a 3D signature for a COTS item.

With reference now to FIG. 4, a suitable MSI method implementing the foregoing and additional aspects is described. The MSI method is suitably implemented by the electronic processor 70, including acquiring images of various modalities by controlling the appropriate imaging scanner 20, 22, 24, 26, and preferably displaying any generated report on the display 72 (and optionally also storing the report in a non-volatile memory, printing the report using a marking engine, transmitting the report via an electronic network such as the Internet, and/or otherwise utilizing the report). At 80, the electronic item 12 is initially unpowered. That is, the electronic item 12 is not receiving electrical power or electrical inputs from the electronic power supply 16. In its unpowered state, the electronic item 12 is imaged at an operation 82 using the visible imaging scanner 20 and the translation table 10 in order to acquire a visible image, preferably of the entire electronic item 12. By imaging the entire electronic item 12, the visible image thus serves as a basis for defining a lateral coordinate system for quantifying locations on the PCB 14 of the electronic item 12. The electronic processor 70 is further programmed to perform optical character recognition (OCR) 84 on the visible image to identify textual content with associated locations on the PCB. In some cases, the OCR may be performed for multiple languages (e.g., English, Chinese, et cetera), and the OCR should encompass recognizing natural language glyphs representing numerals or numbers. In some embodiments, the operation 84 may be extended to detecting symbols other than natural language glyphs, such as recognizing known company logos, electronic component orientation marks, and/or the like. If the image sensor of the visible imaging scanner 20 is a color sensor, then this may also be extended to recognizing color indicators such as color bands used to indicate resistance values of resistors. The operation 84 may use any existing OCR technology.

In an operation 86, the visible image is analyzed to identify electronic components on the PCB 14. This can be done, for example, by applying edge detection to the visible image to detect large image intensity gradients likely to correspond to edges in the image, connectivity analysis to detect edges forming boxes or other closed contours (likely to be the edges of an IC or other electronic component), performing volumetric connectivity analysis of the visible image to identify contiguous areas of common intensity (again, such contiguous areas are likely to correspond to electronic components), using machine learning (ML) techniques, various combinations thereof, and/or so forth. The operation 86 further determines locations of the identified electronic components on the PCB 14 (referenced to the coordinate system of the visible image of the entire PCB), dimensions of the electronic components (including absolute size and/or shape and/or aspect ratio, for example), identifying numbers of pins of the identified electronic components, and so forth, and combines these structural metrics with the textual content generated by the OCR 84 to label the electronic components with part identifiers. To perform the labeling, a parts database 88 is referenced. The parts database 88 stores information about known electronic components (e.g. commercial ICs, standard lumped components, and/or so forth). The stored information may include, for example: textual labels imprinted on commercial ICs; dimensions of known electronic components; numbers of pins of known electronic components; and/or so forth. When the dimensions, number of pins, and any textual labels of an identified electronic component matches a component listed in the parts database 88, it may then be unambiguously labeled with the part identifier of the matching part. The output of the operation 86 is a set of labeled electronic components 90, each labeled with a part identifier (if a match was found in the database 88; otherwise the component may be labeled as unknown; or, if the labeling based on the OCR and the labeling based on the structural metrics do not match then the component may be labeled as ambiguous with both OCR-based and structural metric-based part identifiers listed). The labeled electronic components may also be labeled as to the extracted information (OCR'd text, dimensions, number of pins, coordinates on the PCB).

In an operation 92, the labeled electronic components 90 are optionally compared with a bill of materials (BOM) 94 for the COTS item (assuming the electronic item 12 is a COTS item and the BOM 94 for the COTS product is available in electronic form). If a components layout specification 96 for the COTS product is available, then the operation 92 may further compare the locations of the labeled electronic components 90 with their expected locations from the layout specification 96. A BOM compliance report 98 is generated by the operation 92. The BOM compliance report 98 identifies any missing components (that is, components on the BOM 94 but not among the labeled electronic components 90), any extra components (that is, any labeled electronic component that is not on the BOM), and (if the layout specification 96 is available) information on any substituted components. If the operation 86 identified any discrepancies between the labeling for an electronic component based on the OCR'd text versus the labeling based on structural metrics, this may also be flagged in the BOM compliance report 98.

The labeled electronic components 90, including their coordinates, is also used in an operation 100 to identify areas of significance for more detailed MSI. The detailed criteria for defining an area of significance depends upon the task being performed. For example, in a routine COTS item quality assurance task, it may be sufficient to define areas of significance as any labeled electronic component that is not on the BOM, or any electronic component that is missing (in this case the area of significance would be the expected location of the missing electronic component from the layout specification 96), or any electronic component that is a substitution (that is, an electronic component that is not on the BOM but is located in place of a missing BOM component). The routine COTS item quality assurance task may further include scanning of certain key components that are of particular concern for counterfeiting. For example, if the COTS product employs an FPGA as its principal (and most expensive) IC, and the other components are lower cost ancillary electronics, then a nefarious actor would most likely employ a counterfeit FPGA as this would produce the greatest cost savings. Also, a counterfeit FPGA might be difficult or impossible to identify via the visible image alone—THz imaging may be needed to identify use of substitute (cheaper) materials in the FPGA. Still further, since the FPGA is a custom programmed IC, it may be desired to perform functional imaging of the FPGA using different test vectors to verify the FPGA is properly programmed. Still further, the FPGA may be producing the greatest amount of heat, so that IR imaging of the FPGA may be desired to ensure it does not overheat under a high thermal stress test vector. On the other hand, for a more detailed COTS item quality assurance task, it may be desired to designate each and every electronic component identified in the operation 86 (regardless of its labeling) as an area of significance so as to perform a thorough analysis of every component. Moreover, areas of interest are not necessarily electronic components. For example, it may be desired to randomly identify a set of printed circuit trace portions of the PCB 14 for functional imaging to verify that the metal is sufficiently thick to avoid overheating. (A counterfeit PCB that does not meet specifications may employ thinner printed circuitry). Similarly, it may be desired to randomly identify a few areas of the PCB 14 itself to perform THz imaging to verify composition and lateral uniformity of the PCB 14. Again, these are merely illustrative examples, and additional/fewer/other criteria may be employed for identifying the areas of significance and the type(s) of imaging to be performed for each area.

With continuing reference to FIG. 4, images of the areas of significance are acquired, namely: THz images of the areas of significance (or some subset thereof) are acquired 102; IR images of the areas of significance (or some subset thereof) are acquired 104; and EMI images of the areas of significance (or some subset thereof) are acquired 106. The THz images are acquired 102 as time domain spectroscopy (TDS) images and/or continuous wavelength (CW) images, and are typically acquired for a number of different focal depths 108 (selected using the adjustable delay system of the THz scanner 22 as previously described). Although not shown, it is also contemplated to acquire further (e.g. higher resolution) visible images of the areas of significance using the visible imaging scanner 20. To perform the functional images acquisitions 104, 106, the appropriate imaging scanner 24 or 26 is moved into alignment with the telecentric lens 28 using the linear conveyor belt or revolving conveyor 27. For each test vector 110, the electronic processor 70 controls the electronic power supply 16 in an operation 112 to energize the COTS item 12 in accord with the test vector 110, and a programmed delay is typically included to allow the COTS item 12 to thermally stabilize at the test vector energization conditions, before commencing with the IR imaging 104 or EMI imaging 106. Depending upon the speed of the conveyor 27 compared with the time interval for stabilization at the test vector, it is contemplated to either cycle through all test vectors for the IR imaging and then switch to the EMI imaging using the conveyor 27 and then cycle through the test vectors a second time to perform the EMI imaging; or, to cycle through the test vectors one time, with the conveyor switching between the IR and EMI scanners 24, 26 and performing the respective imaging acquisition 104, 106 in succession for each test vector before moving to the next test vector. (For example, if 10 minutes stabilization time is employed between test vectors and the conveyor 27 can switch between IR and EMI scanners 24, 26 in only a few seconds, then the latter approach is more efficient).

With the images collected, in an operation 114 the images of each modality and parameterization are stitched together, optionally (further) spatially registered, resampled to a single lateral resolution, and any missing data filled in. The resulting images are stacked to form a three-dimensional (3D) signature 120 for the electronic item 12. In describing operation 114, the term "parameterization" refers to the depth parameter in the case of THz imaging, or the test vector parameter in the case of functional imaging. Thus, THz imaging at (illustrative) five different depths produces five THz images, one for each depth; and, the IR imaging at (illustrative) 10 different test vectors produces 10 IR images for the 10 different test vectors. As previously noted, the images of the different modalities are already spatially registered in the lateral direction by virtue of using the common translation table 10 for linear translation of the electronic item 12 and having each imaging modality aligned (during operation) with the optical axis OA. However, if the tolerances of the modality alignments with the OA are unacceptably large then further spatial image registration may be performed by the electronic processor 70. This image registration entails shifting image data in the lateral direction to align with a reference. Since the optical image is preferably of the entire electronic item 12, the optical image is a suitable reference for the spatial registration, and the THz and functional images are shifted laterally to align with the optical image. This can be done rapidly and accurately since the images are already close to the final registration alignment due to the common alignment with the optical axis OA during image scanning. The filling in of missing data refers to the fact that the THz and functional images are acquired as a set of images of the areas of significance, and there are generally lateral gaps between these areas over which no THz or functional image content has been acquired. Various approaches can be used to fill in this missing data. In one approach, the missing data are zero-filled, i.e. any missing image pixels are set to 0. In another approach, the missing image data are filled in with some average value, e.g. the average value of pixels in the acquired areas.

The resampling to a single lateral resolution is performed because (in general) each imaging modality has its own lateral spatial resolution, which may be different from the other imaging modalities. The visible image preferably has a lateral spatial image resolution of 100 micron or finer, which is sufficient to capture text imprinted on electronic components, to image printed circuitry, to capture dimensions of electronic components with a precision of 100 micron or better, and/or so forth. Due to the longer wavelength of light in the infrared, the IR imaging typically has a coarser resolution than the visible image, for example a lateral spatial image resolution of 100 micron or finer in some embodiments. EMI typically has spatial resolution comparable with the IR imaging, e.g. 100 micron or finer in some embodiments. The THz imaging typically has the coarsest resolution, e.g. a lateral spatial image resolution of 500 micron or finer (and a depth resolution of 100 microns or less). If the single lateral resolution is chosen to be one of the coarser resolutions, then the resampling results in a loss of data for the imaging modalities with higher resolution. Accordingly, in a preferred approach the single lateral resolution of the 3D signature 120 is chosen to be the highest resolution of any portion of the visible image, the one or more THz images, and the one or more functional images (e.g., typically the 100 micron or higher resolution of the optical image is chosen as the single lateral resolution) and the resampling then becomes upsampling of any portion of any image with coarser resolution to the highest resolution. This can be done by interpolation.

The resulting 3D signature 120 is preferably a standardized signature in that for every electronic item that is characterized the image layers of the 3D signature 120 are in the same order and are resampled to the same single lateral resolution. This enables the standardized 3D signature 120 to be used in comparing different electronic items (for example, two different COTS items that are nominally the same COTS product) to detect and localize any differences. However, due to the large amount of information contained in the 3D signature 120, in some embodiments artificial intelligence (AI) classifiers are trained to perform analytical tasks. The AI classifiers may be any suitable machine learning (ML) approach. For example, an AI classifier may be a Support Vector Machine (SVM) whose hyperparameters are trained on a training data set, or an artificial neural network (ANN) whose activation function parameters and weights are trained on a training data set, and/or so forth. Different analysis tasks may employ different types of AI classifiers. Moreover, in some cases less than the entire 3D signature 120 may serve as input to the AI classifier. For example, if only one or two imaging modalities are useful (e.g. discriminative) in the analysis, then only the image layers of the 3D signature 120 corresponding to those imaging modalities may serve as inputs.

The 3D signature 120 can also be expanded to incorporate imaging data imported into the system. As previously noted, in the 3D signature 120 the images of each modality and parameterization are stitched together, optionally (further) spatially registered, resampled to a single lateral resolution, and any missing data filled in. In this variant, the stitching, spatial registering, resampling, and data fill-in produce an image of a standard file format that contains the raw sensor data and the homographic matrices which enable the spatial registration (e.g. Euclidean alignment) of any modality with any other modality in this standard file format. As a consequence, an image acquired by another modality such as an X-ray imager can be similarly converted to the standard file format, imported into the multispectral inspection (MSI) system and added to the 3D signature 120. This allows the MSI system to be expanded to incorporate images of the electronic item acquired by other imaging or scanning modalities that are not physically integrated into the MSI imaging platform.

Figure 5:
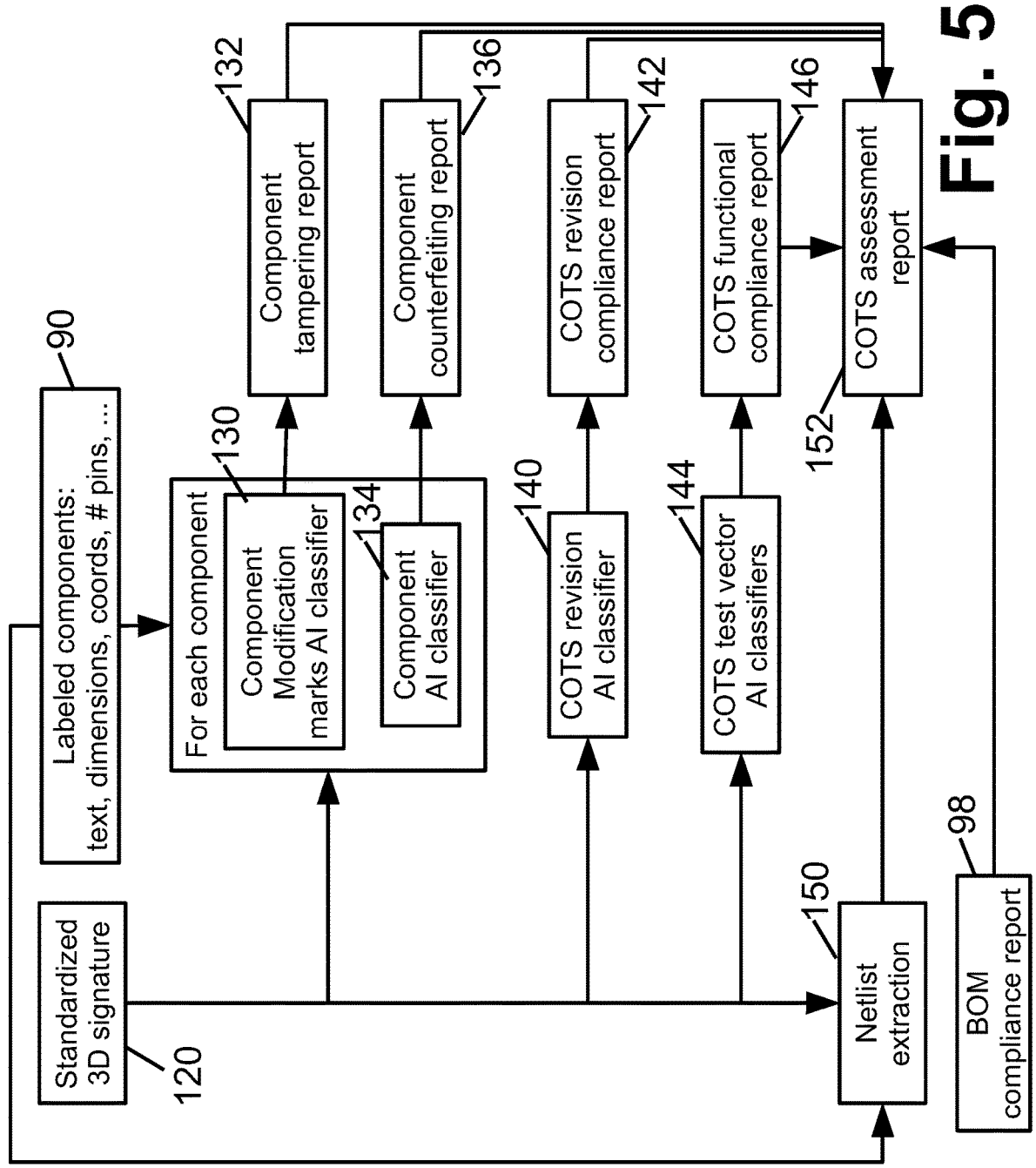
FIG. 5 diagrammatically shows an illustrative example of some tests performed on a COTS using the 3D signature for the COTS item generated by the process of FIG. 4.

With reference now to FIG. 5, some illustrative analysis tasks suitably performed by AI classifiers in the context of COTS item analysis are diagrammatically shown. Some classifiers may operate at the component level. For example, a component modification AI classifier 130 may be trained to detect component modification marks such as scratch and/or abrasion patterns on the surface of an IC that are indicative of use of filing or another abrasive technique to remove a textual label of the IC. Other types of component modification marks may include re-soldering or reworking marks or other marks caused by post-manufacturing modification of the COTS item. Hence, the component modification marks AI classifier 130 is effective for detecting a counterfeit IC. In a suitable approach, to analyze each IC, the lateral area of the 3D signature 120 corresponding to that IC (as obtained from the labeled components 90) serves as input to the component modification marks AI classifier 130. Furthermore, the input may optionally be limited to image layers of the 3D signature 120 corresponding to the visible image and optionally also the IR image, as these modalities are expected to be most sensitive to component modification marks. The output of the component modification marks AI classifier 130 applied to each IC under analysis is suitably compiled as a component tampering report 132 indicating whether each analyzed IC exhibits suspicious markings that may be component modification marks.

Similarly, a component AI classifier 134 may be applied to selected components, or to all components, to identify ICs and other components. As previously discussed, the operation 86 described with reference to FIG. 4 is used to identify components using information in the visible image. However, this component identification may be insufficient for some components. For example, the visible image may identify an FPGA or microprocessor component—however, it cannot identify whether the FPGA or microprocessor is programmed to operate in accord with the COTS product specification. Similarly, the visible image analysis 86 may be insufficient to identify an IC that has the same dimensions, number of pins, and other structural metrics as the compliant IC, but is inferior in some way such as not meeting a "military grade" specification. This counterfeiting by employing an inferior-grade IC may however be detected in the IR and/or EMI images by way of detecting excessive heating and/or excessive radio frequency emissions. Similarly, the THz imaging may detect use of inferior materials in the inferior-grade IC. Typically, the component AI classifier 134 receives the lateral area portion of the 3D signature 120 corresponding to the area of the IC under analysis, and receives the image layers corresponding at least to the IR, EMI, and THz images, and optionally also the visible image layer. The output of the component AI classifier 134 applied to each IC under analysis is suitably compiled as a component counterfeiting report 136 indicating an assessment of whether each analyzed IC may be counterfeit.

With continuing reference to FIG. 5, a COTS revision AI classifier 140 is trained to detect the COTS product revision of the COTS item 12. A revision may entail changes (addition, removal, substitution) of any component on the PCB 14, as well as potentially involving added, removed, or rerouted printed circuit traces, replacement of the PCB with a substitute board, and/or so forth. Accordingly, the COTS revision AI classifier 140 typically receives the entire 3D signature 120 as input. The COTS revision AI classifier 140 may be a single multi-class classifier that outputs the revision with which the 3D signature 120 most closely matches. Alternatively, the COTS revision AI classifier 140 may comprise a set of binary AI classifiers, one for each revision and each trained to output a binary value indicating whether the COTS item 12 matches the revision for which that binary classifier is trained. The output of the COTS revision AI classifier 134 is suitably as a revision compliance report 142 indicating whether the revision of the COTS item 12 matches the expected revision.

With continuing reference to FIG. 5, a set of COTS test vector AI classifiers 144 is trained to assess whether the response of the COTS item 12 to each test vector 110 (see FIG. 4) is compliant with the COTS product specification. One COTS test vector AI classifier is suitably trained for each test vector, and the COTS test vector AI classifiers 144 typically receive the IR and EMI image layers of the 3D signature 120 as input, as these carry the functional information. The COTS test vector AI classifiers 144 may also detect compliant operation of optoelectronic devices, for example by detecting emission of an IR laser component in the IR image layer. Similarly, the COTS test vector AI classifiers 144 may also detect compliant operation of an electronic component which is a radio transmitter or transceiver, by detecting radio transmissions in the EMI layer. The outputs of the COTS test vector AI classifiers 144 are suitably compiled as a COTS functional compliance report 146 indicating whether the revision of the COTS item 12 complies with the specified functionality of the COTS product for the various test vectors.

The AI classifiers 130, 134, 140, 144 are merely illustrative examples, and it is contemplated to employ additional, fewer, and/or different AI classifiers trained to perform various tasks. Other analyses may be performed that do not employ AI classifiers, such as the already-described generation of the BOM compliance report 98. Another non-AI analysis may be a netlist extraction analysis 150 that utilizes the labeled components 90 including the coordinates of each component, together with extraction of printed circuit traces to generate a netlist identifying the wired connections between the electronic components. The traces may be extracted from the visible image. IR and/or EMI images may be used to detect traces that are occluded from view in the visible image via their heat and EMI emissions during certain test vectors. The THz images may additionally or alternatively detect traces that are occluded from view (and that may not be energized by any of the test vectors and hence invisible in the IR and EMI images). To provide more complete netlist content, electronic datasheets for the labeled components 90 may be references to identify specific pins of the ICs, so as to provide the netlist indicating by which pins the various ICs are interconnected with other electronic components. The various reports 98, 132, 136, 142, 146, and the netlist, are suitably compiled in a COTS assessment report 152 that may be displayed on the display 72 of the computer or other electronic processor 70.

Figure 6:
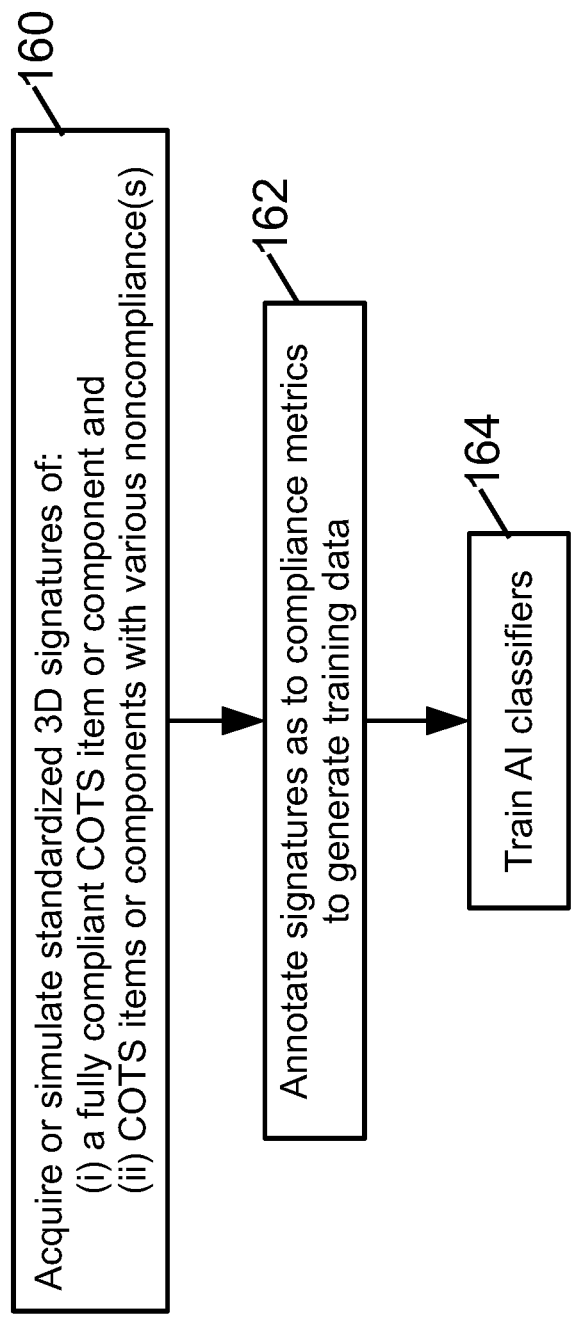
FIG. 6 diagrammatically shows an illustrative approach for training the artificial intelligence (AI) classifiers used in tests such as those of FIG. 5.

With reference to FIG. 6, training of the various AI classifiers 130, 134, 140, 144 is described. The training requires a training set of positive and/or negative examples (preferably both positive and negative examples). Accordingly, in an operation 160 the standardized 3D signatures are acquired or simulated for (i) a fully compliant COTS item (or electronic component, in the case of per-component AI classifiers 130, 134), and (ii) COTS items (or components) with various non-compliances. The non-compliances should be relevant to the particular AI classifier being trained. For example, to train the component modification marks AI classifier 130 the non-compliant electronic components should have filing or abrasion marks or other component modification marks due to modification of the ICs. If the COTS revision AI classifier 140 is a single multi-class classifier, then the training set should include COTS items of different revisions (in this case "positive" and "negative" examples is not meaningful). On the other hand, if the COTS revision AI classifier 130 comprises a set of binary classifiers for the different revisions, then for a given binary classifier the positive examples are those training COTS items of that revision while the negative examples are those training COTS items of different revisions. The training set for a COTS test vector AI classifier 144 for a particular test vector includes positive examples of COTS items whose functionality is compliant for that test vector and negative examples of COTS items whose functionality is not compliant for that test vector.

If a number of COTS items nominally corresponding to the COTS product are available, then the operation 160 may entail performing the process of FIG. 4 for generating the 3D signature for each training COTS item. The resulting training 3D signature is annotated in an operation 162 as to test vector compliance/noncompliance, COTS revision, and (for various components) whether they have component modification marks and whether the components are counterfeit. This information may be obtained by manual inspection of the images generated in the process of FIG. 4, and/or based on a priori information such as known revision information, known counterfeit components, and/or so forth.

In some situations, a suitable training set of COTS items may not be available. For example, only fully compliant COTS items may be available. In this case, the operation 160 may be performed by performing the image acquisition operations of the process of FIG. 4, followed by using image editing software (e.g., Photoshop or Gimp) to modify the images to simulate various non-compliances. The annotation operation 162 then annotates the images with respect to the simulated non-compliances. A combination of actual and simulated non-compliances may also be employed.

In an operation 164, the AI classifiers are trained using the annotated training data set generated by the operations 160, 162. For example, in training a SVM classifier, the SVM hyperparameters are trained to optimally distinguish between the compliant and non-compliant examples of the training data set. Similarly, for an ANN classifier, the activation function parameters and weights of the ANN are trained to optimally distinguish between the compliant and non-compliant examples of the training data set.

The preferred embodiments have been illustrated and described. Obviously, modifications and alterations will occur to others upon reading and understanding the preceding detailed description. It is intended that the invention be construed as including all such modifications and alterations insofar as they come within the scope of the appended claims or the equivalents thereof.

The invention claimed is:

1. A multispectral inspection (MSI) device for inspecting an associated electronic item including a printed circuit board (PCB), the MSI device comprising:
   an electronic power supply configured to electrically power the associated electronic item in accordance with one or more test vectors;
   an optical imaging scanner configured to scan the associated electronic item, wherein the optical imaging scanner has a lateral spatial image resolution of 100 micron or finer;
   a functional imaging scanner configured to scan the associated electronic item, wherein the functional imaging scanner has a lateral spatial image resolution of 100 micron or finer; and
   an electronic processor programmed to:
      control the optical imaging scanner to acquire an optical image of the associated electronic item;
      control the functional imaging scanner and the electronic power supply to acquire one or more functional images of the associated electronic item powered in accord with respective one or more test vectors using the electronic power supply; and
      combine the optical image and the one or more functional images to generate a three-dimensional (3D) signature for the associated electronic item comprising a stack of the images, wherein the combining to generate the 3D signature includes resampling the images to a single lateral resolution;
      wherein the single lateral resolution of the 3D signature is a highest resolution of any portion of the optical image and the one or more functional images and the combining includes upsampling any portion of any image with coarser resolution to the highest resolution.

2. The MSI device of claim 1 further comprising:
   a terahertz (THz) imaging scanner configured to scan the associated electronic item, wherein the THz imaging scanner has a lateral spatial image resolution of 500 micron or finer and a depth resolution of 100 microns or less;
   wherein the electronic processor is further programmed to control the THz imaging scanner to acquire one or more THz images of the associated electronic item at respective one or more depths.

3. The MSI device of claim 2 wherein the electronic processor is programmed to combine the optical image and the one or more functional images and the one or more THz images to generate the 3D signature for the associated electronic item comprising the stack of the images including the optical image, the one or more functional images, and further including the one or more THz images.

4. The MSI device of claim 1 wherein the associated electronic item is an instance of a Commercial Off-The-Shelf (COTS) product, and the electronic processor is further programmed to:
   identify a revision of the associated electronic item by comparison of the 3D signature generated for the associated electronic item with 3D signatures generated for a plurality of different revisions of the COTS product; and
   outputting an assessment report including the identified revision of the associated electronic item.

5. The MSI device of claim 1 wherein the electronic processor is further programmed to:
  process the 3D signature generated for the associated electronic item using an artificial intelligence (AI) classifier trained to detect component modification marks; and
  outputting an assessment report summarizing any component modification marks identified by the processing using the AI classifier trained to detect component modification marks.

6. The MSI device of claim 1 wherein the optical imaging scanner comprises at least one of a visible imaging scanner, a laser profilometer, and/or a three-dimensional (3D) scanner with at least two cameras providing a stereographic image.

7. The MSI device of claim 1 wherein the functional imaging scanner comprises at least one of an infrared (IR) imaging scanner wherein the one or more functional images are one or more IR images, and/or an electromagnetic interference imaging (EMI) scanner wherein the one or more functional images are one or more EMI images.

8. The MSI device of claim 1 wherein one of:
  the MSI device further comprises a translation table configured to laterally translate the associated electronic item, and the optical imaging scanner and the functional imaging scanner are each configured to scan the associated electronic item by lateral translation of the associated electronic item relative to the scanner using the translation table; or
  the MSI device further comprises a stationary table, and the optical imaging scanner and the functional imaging scanner are each configured to move respective to the stationary table to scan the associated electronic item.

9. A multispectral inspection (MSI) device for inspecting an associated electronic item including a printed circuit board (PCB), the MSI device comprising:
  an electronic power supply configured to electrically power the associated electronic item in accordance with one or more test vectors;
  an optical imaging scanner configured to scan the associated electronic item, wherein the optical imaging scanner has a lateral spatial image resolution of 100 micron or finer;
  a functional imaging scanner configured to scan the associated electronic item, wherein the functional imaging scanner has a lateral spatial image resolution of 100 micron or finer; and
  an electronic processor programmed to:
    control the optical imaging scanner to acquire an optical image of the associated electronic item;
    control the functional imaging scanner and the electronic power supply to acquire one or more functional images of the associated electronic item powered in accord with respective one or more test vectors using the electronic power supply;
    analyze the optical image to identify areas of significance of the associated electronic item, wherein the analysis of the optical image to identify the areas of significance includes analyzing the optical image to identify electronic components mounted on the PCB; and
    label the identified electronic components with part identifiers using one or more of the optical image and the one or more functional images;
    wherein at least one of:
      (i) the analysis of the optical image to identify electronic components mounted on the PCB includes identifying dimensions of the identified electronic components and locations of the identified electronic components on the PCB, wherein the electronic components are labeled with part identifiers based at least in part on the dimensions of the identified electronic components, and/or
      (ii) the analysis of the optical image to identify electronic components mounted on the PCB further includes identifying numbers of pins of the identified electronic components, wherein the electronic components are labeled with part identifiers based at least in part on the numbers of pins of the identified electronic components.

10. The MSI device of claim 9 wherein the control of the functional imaging scanner to acquire one or more functional images of the associated electronic item includes acquiring the functional images only of the areas of significance.

11. The MSI device of claim 9 wherein the analysis of the optical image to identify electronic components mounted on the PCB includes:
  identifying dimensions of the identified electronic components and locations of the identified electronic components on the PCB;
  wherein the electronic components are labeled with part identifiers based at least in part on the dimensions of the identified electronic components.

12. The MSI device of claim 9 wherein the analysis of the optical image to identify electronic components mounted on the PCB further includes:
  identifying numbers of pins of the identified electronic components;
  wherein the electronic components are labeled with part identifiers based at least in part on the numbers of pins of the identified electronic components.

13. The MSI device of claim 9 wherein the electronic processor is further programmed to perform optical character recognition (OCR) on the optical image to identify textual content with associated locations on the PCB and/or the electronic components;
  wherein the electronic components are labeled with part identifiers based at least in part on the textual content with associated locations on the PCB and/or the electronic components.

14. A multispectral inspection (MSI) device for inspecting an associated Commercial Off The Shelf (COTS) product including a printed circuit board (PCB), the MSI device comprising:
  an electronic power supply configured to electrically power the associated COTS product in accordance with one or more test vectors;
  an optical imaging scanner configured to scan the associated COTS product, wherein the optical imaging scanner has a lateral spatial image resolution of 100 micron or finer;
  a functional imaging scanner configured to scan the associated COTS product, wherein the functional imaging scanner has a lateral spatial image resolution of 100 micron or finer; and
  an electronic processor programmed to:
    control the optical imaging scanner to acquire an optical image of the associated COTS product;
    control the functional imaging scanner and the electronic power supply to acquire one or more functional images of the associated COTS product powered in accord with respective one or more test vectors using the electronic power supply;

analyze the optical image to identify areas of significance of the associated COTS product, wherein the analysis of the optical image to identify the areas of significance includes analyzing the optical image to identify electronic components mounted on the PCB;

label the identified electronic components with part identifiers using one or more of the optical image and the one or more functional images;

compare the labeled part identifiers with a bill of materials (BOM) for the associated COTS product; and output a BOM compliance report summarizing the comparison with the BOM.

15. The MSI device of claim 14 wherein:

the electronic components are labeled with part identifiers further based on structural metrics of the electronic components determined using the one or more of the optical image and the one or more functional images; and the electronic processor is further programmed:

identify inconsistencies between part identifier labels identified based on the textual content and part identifier labels identified based on the structural metrics, and wherein the BOM compliance report further summarizes the identified inconsistencies.

16. A multi-spectral inspection (MSI) method performed on an associated electronic item having a printed circuit board (PCB), the MSI method comprising:

controlling an optical imaging scanner to acquire an optical image of the associated electronic item;

analyzing the optical image to identify areas of significance of the associated electronic item;

controlling a functional imaging scanner and an electronic power supply to acquire functional area images of the areas of significance with the associated electronic item powered in accord with one or more test vectors using the electronic power supply;

generating a functional image for each test vector by combining the functional images acquired with the associated electronic item powered in accord with that test vector;

generating a three-dimensional (3D) signature for the associated electronic item comprising a stack of the optical image and the functional images at the one or more test vectors; and performing at least one MSI analysis by processing the 3D signature using one or more artificial intelligence (AI) classifiers;

wherein the associated electronic item is an instance of a Commercial Off-The-Shelf (COTS) product, and the performing of the at least one MSI analysis includes performing a revision identification analysis by processing the 3D signature using one or more AI classifiers trained on 3D signatures generated for different revisions of the COTS product each labeled by the respective revision.

17. The MSI method of claim 16 further comprising:

controlling a terahertz (THz) imaging scanner to acquire THz area images of the areas of significance at one or more depths; and generating a THz image for each depth by combining the THz area images at that depth;

wherein the generating of the 3D signature comprises generating the 3D signature for the associated electronic item comprising a stack of the optical image, the THz images at the one or more depths, and the functional images at the one or more test vectors.

18. The MSI method of claim 16 wherein the generating of the 3D signature includes resampling the images to a single lateral resolution.

19. The MSI method of claim 16 wherein the performing of the at least one MSI analysis further includes:

processing the 3D signature using at least one artificial intelligence (AI) classifier trained to detect component modification marks; and outputting an assessment of whether the electronic item contains component modification marks based on the processing.

20. A non-transitory storage medium storing instructions readable and executable by an electronic processor to perform a multispectral inspection (MSI) method of an associated electronic item having a printed circuit board (PCB), the MSI method comprising:

controlling an optical imaging scanner to acquire an optical image of the associated electronic item;

analyzing the optical image to identify electronic components mounted on the PCB, locations of the electronic components on the PCB, and structural metrics of the electronic components;

performing optical character recognition (OCR) on the optical image to identify textual content with associated locations on the PCB; and labeling the identified electronic components with part identifiers based at least on the structural metrics of the electronic components and the textual content with associated locations on the PCB, wherein the structural metrics include dimensions of the identified electronic components and numbers of pins of the identified electronic components.

21. The non-transitory storage medium of claim 20 wherein the MSI method further includes:

controlling a THz imaging scanner to acquire THz images at different depths of at least the electronic components; and analyzing the THz images to identify compositional characteristics of the identified electronic components;

wherein the labeling of the identified electronic components with part identifiers is further based on the compositional characteristics of the identified electronic components.

22. A non-transitory storage medium storing instructions readable and executable by an electronic processor to perform a multispectral inspection (MSI) method of an associated Commercial Off-The-Shelf (COTS) product having a printed circuit board (PCB), the MSI method comprising:

controlling an optical imaging scanner to acquire an optical image of the associated COTS product;

analyzing the optical image to identify electronic components mounted on the PCB, locations of the electronic components on the PCB, and structural metrics of the electronic components;

performing optical character recognition (OCR) on the optical image to identify textual content with associated locations on the PCB;

labeling the identified electronic components with part identifiers based at least on the structural metrics of the electronic components and the textual content with associated locations on the PCB;

comparing the identified and labeled electronic components with a bill of materials (BOM) for the associated COTS product; and generating a BOM compliance report for the associated COTS product based on the comparison.

23. The non-transitory storage medium of claim 22 wherein the BOM compliance report is generated further based on a comparison of the locations of the electronic components on the PCB with a components layout specification for the associated COTS product.

24. A non-transitory storage medium storing instructions readable and executable by an electronic processor to perform a multispectral inspection (MSI) method of an associated electronic item having a printed circuit board (PCB), the MSI method comprising:

controlling an optical imaging scanner to acquire an optical image of the associated electronic item;

analyzing the optical image to identify electronic components mounted on the PCB, locations of the electronic components on the PCB, and structural metrics of the electronic components;

performing optical character recognition (OCR) on the optical image to identify textual content with associated locations on the PCB; and labeling the identified electronic components with part identifiers based at least on the structural metrics of the electronic components and the textual content with associated locations on the PCB;

wherein the labeling comprises:

labeling the identified electronic components with first candidate part identifiers based on the metrics of the electronic components but not based on the textual content with associated locations on the PCB;

labeling the identified electronic components with second candidate part identifiers based on the textual content with associated locations on the PCB but not based on the metrics of the electronic components; and generating an assessment report for the associated electronic item identifying any differences between the first candidate part identifiers and the second candidate part identifiers.

\* \* \* \* \*